US007042971B1

(12) United States Patent
Flanagan et al.

(10) Patent No.: US 7,042,971 B1
(45) Date of Patent: *May 9, 2006

(54) DELAY-LOCKED LOOP WITH BUILT-IN SELF-TEST OF PHASE MARGIN

(75) Inventors: Ian M. Flanagan, Edina, MN (US); Roger L. Roisen, Minnetrista, MN (US); Dayanand K. Reddy, Farmington, MN (US); Joel J. Christiansen, Independence, MN (US)

(73) Assignee: LSI Logic Corporation, Milpitas, CA (US)

( * ) Notice: Subject to any disclaimer, the term of this patent is extended or adjusted under 35 U.S.C. 154(b) by 1131 days.

This patent is subject to a terminal disclaimer.

(21) Appl. No.: 09/879,416

(22) Filed: Jun. 12, 2001

(51) Int. Cl.
   *H03D 3/24* (2006.01)
   *H04L 7/02* (2006.01)
   *H03L 7/06* (2006.01)
   *H03L 7/00* (2006.01)

(52) U.S. Cl. ............... 375/376; 375/359; 327/156; 327/158; 331/25

(58) Field of Classification Search ............... 375/295, 375/316, 354, 371, 373, 224, 226, 376, 359, 375/374; 331/25; 327/156, 158
See application file for complete search history.

(56) References Cited

U.S. PATENT DOCUMENTS 5,828,250 A * 10/1998 Konno .................. 327/116
5,963,069 A * 10/1999 Jefferson et al. .......... 327/158
6,173,432 B1 * 1/2001 Harrison .................... 716/1
6,212,127 B1 * 4/2001 Funaba et al. ............ 365/233
6,262,634 B1 * 7/2001 Flanagan et al. ........... 331/25
6,392,456 B1 * 5/2002 Pyeon et al. .............. 327/156
6,868,504 B1 * 3/2005 Lin ........................... 713/500

OTHER PUBLICATIONS

F.M. Gardner, "Charge-Pump Phase-Lock Loops", IEEE Transactions on Communications, vol. COM-28, No. 11, Nov. 1980, pp. 1849-1858.
W.F. Egan, "Phase Lock Basics", Wiley Interscience Publications, New York, 1998, pp. 90-91.
P.V. Brennan, "Phase Locked Loops: Principles and Practice", McGraw-Hill, New York, 1996, p. 35.
D.H. Wolaver, "Phase-Locked Loop Circuit Design", PTR Prentice Hall, New Jersey, 1991, pp. ix-x.

* cited by examiner

*Primary Examiner*—Jay K. Patel
*Assistant Examiner*—Aslan Ettehadieh
(74) *Attorney, Agent, or Firm*—Westman, Champlin, Kelly, P.A.

(57) ABSTRACT

A method and apparatus for measuring phase margin of a delay-locked loop (DLL) is provided in which a reference clock is applied to a reference input of the DLL. An auxiliary variable delay is coupled within the DLL and is varied until the DLL becomes unstable. A phase margin output is generated as a function of a value of the variable delay at which the DLL becomes unstable.

18 Claims, 6 Drawing Sheets

DELAY-LOCKED LOOP WITH BUILT-IN SELF-TEST OF PHASE MARGIN

CROSS-REFERENCE TO RELATED APPLICATION

Cross-reference is made to application Ser. No. 09/548, 498, filed Apr. 13, 2000 and entitled "PHASE-LOCKED LOOP WITH BUILT-IN SELF-TEST OF PHASE MARGIN AND LOOP GAIN."

BACKGROUND OF THE INVENTION

The present invention relates to semiconductor integrated circuits and, more particularly, to a circuit for measuring the phase margin of a delay-locked loop.

Delay-locked loops (DLLs) are used in integrated circuits for removing phase differences between clocks, such as phase differences caused by propagation delay. A typical DLL includes a phase/frequency detector, a charge pump, a loop capacitor and a voltage-controlled delay line. The phase/frequency detector detects a phase difference between a reference clock signal and a feedback clock signal. The phase/frequency detector generates a phase control signal as a function of the phase difference and applies the phase control signal to the charge pump, which increases or decreases a voltage across the loop capacitor. This voltage is applied to a control input of the voltage-controlled delay line for controlling the propagation delay through the delay line. The reference clock is passed through the delay line to generate a delayed DLL output clock, which is fed back to the phase detector as the feedback clock. The delay line advances or retards the phase of the DLL output clock until the phase of the feedback clock matches the phase of the reference clock. The DLL has then locked the DLL output clock signal onto the phase of the reference clock signal.

In integrated circuit applications, it is important that the phase margin of a DLL lies within predefined specifications. However, the phase margin can vary by as much as a factor of two or more from one integrated circuit to the next due to variations in process, supply voltage and temperature, which are known as "PVT". Variations in the phase margin that exceed specified margins can lead to difficulties in clock synchronization and other functions commonly performed by DLLs. Therefore, it is desired to have the capability of measuring the phase margin for each integrated circuit instance and to use this measurement as part of a built-in self-test function for the DLL portion of the integrated circuit.

SUMMARY OF THE INVENTION

One aspect of the present invention is directed to a method of measuring phase margin of a delay-locked loop (DLL). According to the method, a reference clock is applied to a reference input of the DLL. An auxiliary variable delay is coupled within the DLL and is varied until the DLL becomes unstable. A phase margin output is generated as a function of a value of the variable delay at which the DLL becomes unstable.

Another aspect of the present invention is directed to a delay-locked loop (DLL), which includes a reference input, a feedback input and a DLL output coupled to the feedback input. A phase detector is coupled to the reference input and the feedback input and has a phase control output. A charge pump is coupled to the phase control output, and a loop filter is coupled to an output of the charge pump. A main variable delay element is coupled between the reference input and the DLL output and has a first control input coupled to the loop filter. An auxiliary variable delay element is coupled in series with the main variable delay element, between the reference input and the feedback input, and has a second control input and an auxiliary delay. The auxiliary delay is variable to a critical delay at which the DLL becomes unstable. A phase margin measurement circuit generates a phase margin output based on the critical delay at which the DLL becomes unstable.

Yet another aspect of the present invention is directed to a delay-locked loop (DLL) having a reference input for receiving a reference signal, a feedback input for receiving a feedback signal and a DLL output coupled to the feedback input. A first variable delay element is coupled between the reference input and the DLL output for providing a first variable delay within the DLL. A phase control circuit detects a phase difference between the reference signal and the feedback signal and varies the first variable delay as a function of the phase difference. A phase margin measurement circuit adds further delay in series with the first variable delay element, between the reference input and the feedback input, and generates a phase margin output as a function of an amount of the further delay that is required for the DLL to become unstable.

DETAILED DESCRIPTION OF THE PREFERRED EMBODIMENTS

The delay-locked loop (DLL) of the present invention enables a self-test measurement of the DLL's phase margin, which can be used to verify that the DLL is operational and that the performance characteristics of the DLL are within predefined specifications. These self-test measurements can be performed with circuitry that is fabricated with the DLL on an integrated circuit as part of a Built-In Self-Test (BIST) feature for the DLL or with circuitry that is external to the integrated circuit.

Figure 1:
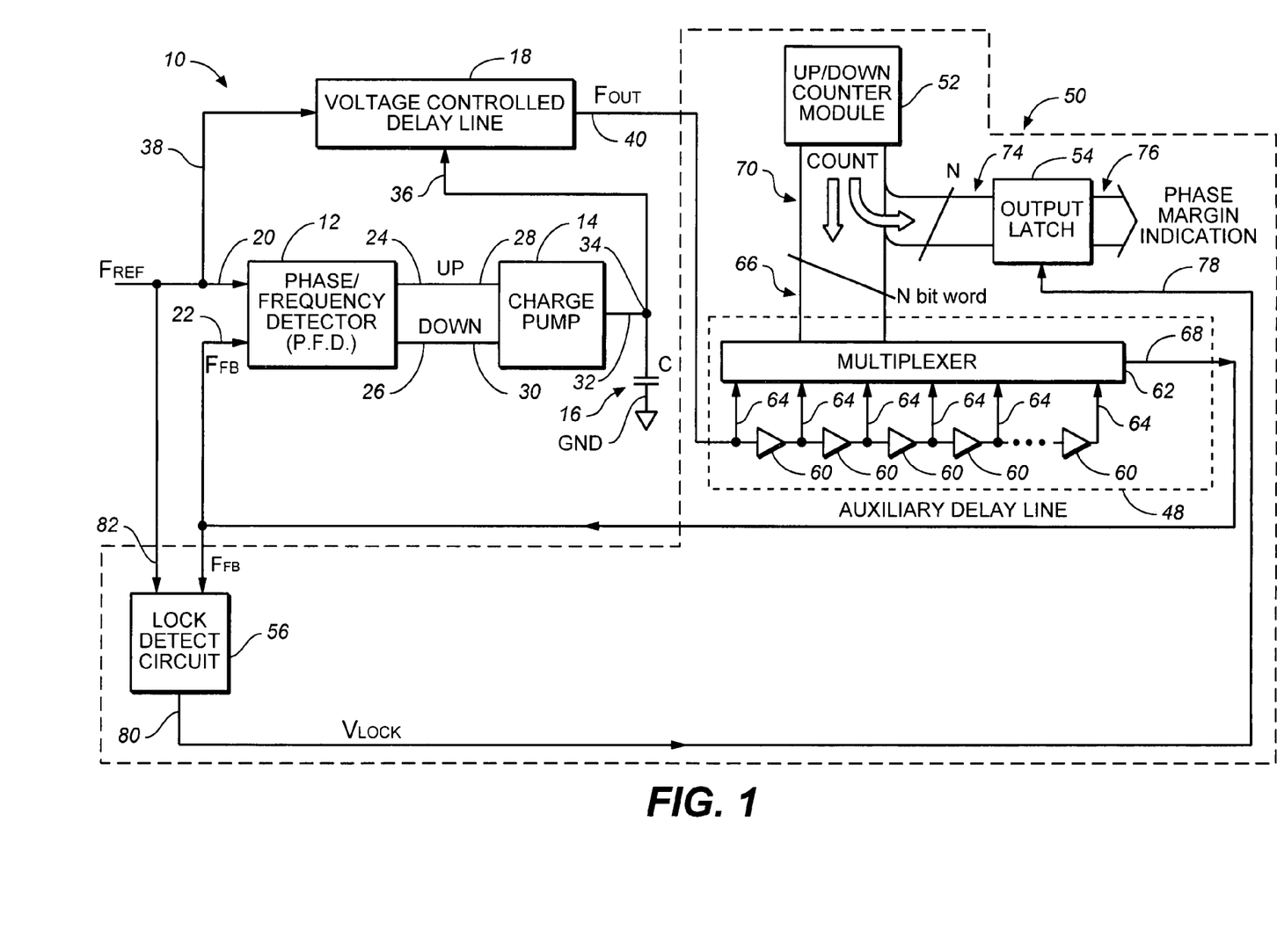
FIG. 1 is a block diagram of a delay-locked loop (DLL) 10 having a built-in phase margin measurement circuit according to one embodiment of the present invention.

FIG. 1 is a block diagram of a delay-locked loop (DLL) 10 having a built-in phase margin measurement circuit according to one embodiment of the present invention. DLL 10 includes phase/frequency detector 12, charge pump 14, loop filter 16 and voltage-controlled delay line 18, which together form a phase detection loop. Phase/frequency detector 12 has a reference input 20, a feedback input 22 and charge pump control outputs 24 and 26. Outputs 24 and 26 are coupled to inputs 28 and 30 of charge pump 14. Charge pump 14 has an output 32 which is coupled to loop filter node 34 and control input 36 of voltage-controlled delay line 18. Loop filter 16 includes capacitor C which is coupled between filter node 34 and ground terminal GND. Voltage-controlled delay line 18 has a reference input 38 coupled to reference input 20 and a DLL output 40 (labeled $F_{OUT}$) coupled to feedback input 22, through an auxiliary delay line 48.

During normal operation, a reference input signal $F_{REF}$ is applied to reference input 20. Phase/frequency detector 12 detects a phase difference between reference input signal $F_{REF}$ and a feedback signal $F_{FB}$ applied to feedback input 22. Phase/frequency detector 12 generates "up" and "down" signals on outputs 24 and 26 as a function of the difference. The up and down signals are applied to charge pump 14, which causes the charge pump to increase, decrease or not change the voltage on loop filter node 34. Voltage-controlled delay line 18 receives the voltage on filter node 34 at its control input 36 and responsively increases, decreases or does not change its propagation delay from reference input 38 to DLL output 40. In one embodiment, voltage-controlled delay line 18 includes one or more voltage-controlled delay elements which are coupled together in series between input 38 and output 40. The propagation delay from a rising (or falling) edge at input 38 to its corresponding rising (or falling) edge at output 40 can be inversely proportional to the voltage applied to control input 36 or proportional to the voltage applied to control input 36, with the appropriate control signals being applied to charge pump 14.

DLL output signal $F_{OUT}$ from voltage-controlled delay line 18 is fed back to feedback input 22 of phase/frequency detector 12 as a feedback signal $F_{FB}$ through auxiliary delay line 48. Phase/frequency detector 12 continues to adjust the "up" and "down" control signals provided to charge pump 14 until DLL 10 locks the phase of the feedback signal $F_{FB}$ onto the phase of the input reference signal $F_{REF}$. Any suitable phase/frequency detector can be used with the present invention. An example of one suitable detector is disclosed in Fiedler et al. U.S. Pat. No. 5,633,899, entitled "Phase Locked Loop For High Speed Data Capture of a Serial Data Stream."

In integrated circuit applications, it is important that the performance characteristics of an embedded DLL lie within predefined specifications. One such characteristic is the phase margin ($\phi_m$) for the DLL. However, the phase margin can vary by as much as a factor of two or more from one integrated circuit to the next due to variations in process, supply voltage and temperature, which are known as "PVT". Therefore, it is desired to have the capability of measuring the phase margin ($\phi_m$) for each integrated circuit instance.

DLL 10 enables a self-test of the phase margin through a phase margin measurement circuit 50, which is fabricated with the other components of DLL 10 on a single semiconductor integrated circuit. In an alternative embodiment, one or more components of measurement circuit 50 is external to the integrated circuit. Measurement circuit 50 includes auxiliary delay line 48, up/down counter 52, output latch 54 and lock detect circuit 56. In one embodiment, auxiliary delay line 48 includes a series of delay cells 60 and a multiplexer 62. Delay cells 60 can include a series of non-inverting buffers or an even-numbered series of inverting buffers, for example. Other types of delay cells can also be used. The output of each delay cell 60 is coupled to a respective data input 64 of multiplexer 62. Also, the input of the first delay cell 60 in the series is coupled to a respective data input 64 of multiplexer 62. This input provides substantially zero delay from the input of delay line 48 to multiplexer output 68, and each successive delay cell output provides a successively greater delay from the input of delay line 48 to multiplexer output 68.

Multiplexer 62 further includes an n-bit select control input 66, which is coupled to an n-bit digital word output 70 (labeled "COUNT") of up/down counter 52. The value of "n" is a function of the number of data inputs 64 to multiplexer 62. Depending upon the value of the digital word presented on select control input 66, multiplexer 62 directs the output waveform of a particular delay cell 60 (or the input of the first delay cell in the series) to multiplexer output 68. The overall effect is that the delay between the rising (or falling) edges at the input of auxiliary delay line 48 and the corresponding rising (or falling) edges at multiplexer output 68 varies in accordance with the rise and fall of the digital word value provided by up/down counter 52.

Output latch 54 has an n-bit latch input 74, an n-bit latch output 76 and a latch control input 78. Latch input 74 is coupled to up/down counter output 70. Latch control input 78 is coupled to lock output 80 (labeled $V_{LOCK}$) of lock detect circuit 56. As described in more detail below, output latch 54 latches the digital word value on counter output 70 when DLL 10 transitions from a locked state to an unlocked state, as indicated by lock output 80.

Lock detect circuit 56 has inputs 82 and 84 which are coupled to reference input 20 and feedback input 22, respectively, of phase/frequency detector 12 for receiving the reference signal $F_{REF}$ and the feedback signal $F_{FB}$. In one embodiment, lock detect circuit 56 generates a logic "high" value on lock output 80 when the phase error between the reference signal $F_{REF}$ and the feedback signal $F_{FB}$ remains smaller than a preset value for a preset time period Otherwise, it generates a logic "low" value on lock output 80. At the falling edge of $V_{LOCK}$, output latch 54 latches the counter output 70 to latch output 76. The internal operation of lock detect circuit 56 is described in more detail below with reference to FIG. 7.

During normal operation, up/down counter 52 is inactivated and counter output 70 has an initial, default value of zero, for example. This zero value selects the first multiplexer input 64, which is coupled to the input of the first delay cell 60 in auxiliary delay line 48. As a result, delay line 48 has substantially zero delay from its input to its output, except for the minimal delay through multiplexer 62. DLL 10 functions normally as described above to remove the phase error between reference input $F_{REF}$ and DLL output $F_{OUT}$.

In test mode, a reference clock signal having a steady-state reference frequency is applied to reference input $F_{REF}$. After DLL 10 has locked, counter 52 is activated and increments the counter output 70 (COUNT) from the initial zero value to a predetermined maximum value and then decrements COUNT from the maximum value to the initial zero value in a "stepped-triangle waveform" fashion. As the value of COUNT increases from zero, the time delay through auxiliary delay line 48 increases. At a critical value $COUNT_{CRIT}$, DLL 10 drops out of phase lock, and $V_{LOCK}$ switches from a logic high value to a logic low value.

As the value of COUNT drops below the value of COUNT$_{CRIT}$, DLL 10 re-acquires lock, and the V$_{LOCK}$ switches from low to high. This cycle continues to repeat at the frequency of the COUNT triangle sequence. In one embodiment, the frequency of the COUNT triangle sequence (i.e., the repetition frequency of COUNT) is set such that the COUNT repetition period has a value that is at least 100 times lower than the "in specification" DLL lock-time. However, other values can also be used in alternative embodiments.

The amount of added delay that is required to cause DLL 10 to become unstable is monotonically related to the DLL phase margin. This phase margin is normally slightly less than 90 degrees, but can have other values in alternative embodiments. The value of COUNT$_{CRIT}$ is latched by output latch 54 when V$_{LOCK}$ transitions from high to low, indicating phase lock has been lost. The value of COUNT$_{CRIT}$ on latch output 76 therefore gives a direct indication of the phase margin, with a higher value of COUNT$_{CRIT}$ indicating a higher phase margin and a lower value of COUNT$_{CRIT}$ indicating a lower phase margin.

In alternative embodiments, the value of COUNT$_{CRIT}$ can be inversely proportional to the phase margin if the control inputs 66 of multiplexer 62 are reversed with respect to the output bits of counter 52 or if the delay otherwise decreases with increasing values of COUNT.

Also, the auxiliary delay line 48 can be physically located anywhere within the delay loop from reference input 20 to feedback input 22, through DLL output 40.

Figure 2:
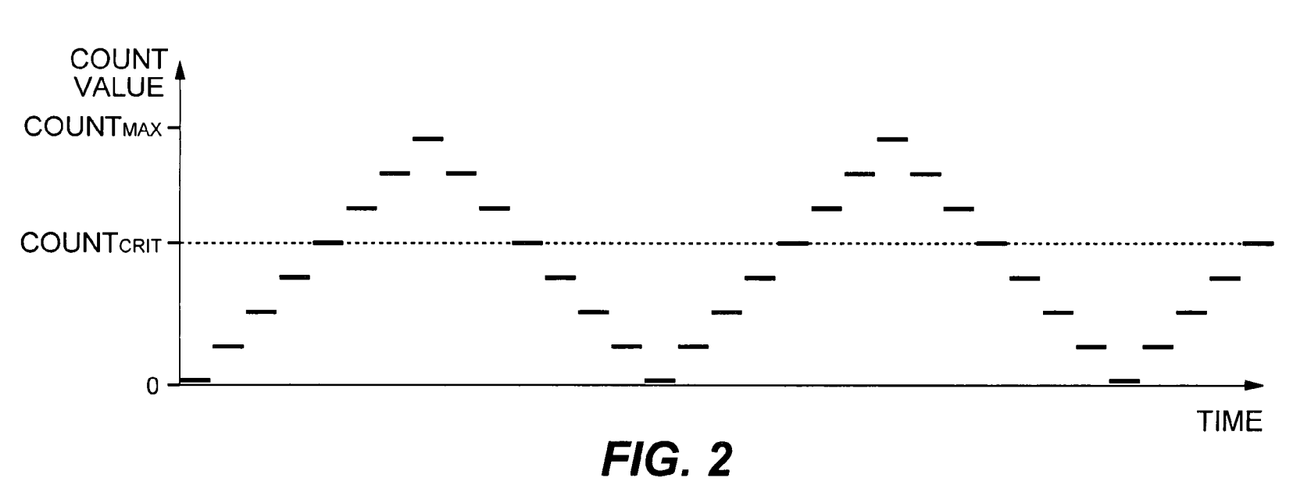
FIG. 2 is a waveform diagram illustrating the output of a counter used in the DLL shown in FIG. 1 over time.

FIG. 2 is a waveform diagram illustrating the value of COUNT at counter output 70 over time. The value of COUNT is incremented from an initial zero value to a predetermined maximum value COUNT$_{MAX}$ and then decremented from COUNT$_{MAX}$ to the zero value. This pattern repeats in a stepped triangular fashion.

Figure 3:
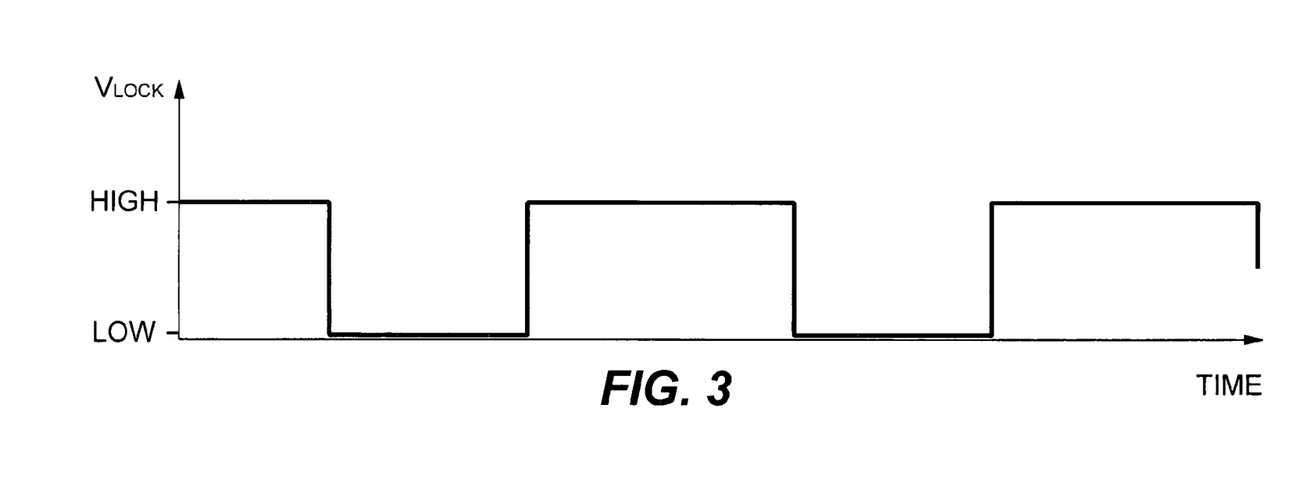
FIG. 3 is a waveform diagram illustrating the value of a lock detect output over time in response to changes in the counter output and thus the delay in the DLL.

FIG. 3 illustrates the value of V$_{LOCK}$ over time in response to the value of COUNT. As COUNT reaches COUNT$_{CRIT}$, V$_{LOCK}$ transitions from high to low indicating that DLL 10 has lost phase lock. As COUNT decreases from COUNT$_{MAX}$ and reaches COUNT$_{CRIT}$, V$_{LOCK}$ transitions from low to high indicating that DLL 10 has regained phase lock. Thus, the falling (or rising) transition of V$_{LOCK}$ can be used to latch the value of COUNT$_{CRIT}$.

Figure 4A:
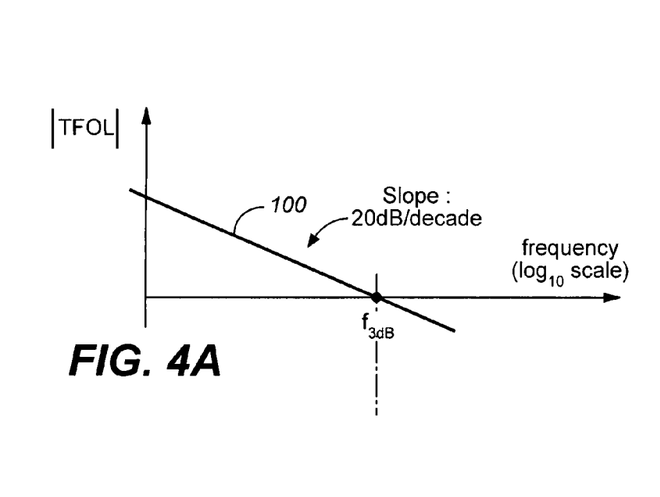
FIGS. 4A and 4B are graphs illustrating magnitude and phase angle of the open loop phase transfer function of a typical DLL, which has no auxiliary delay element in the loop, as a function of frequency.

FIG. 4A is a graph illustrating the magnitude of the open loop phase transfer function (TFOL) 100 in dB as a function of frequency (in the log base 10 scale) for a typical DLL, which has no auxiliary delay line in the loop. Transfer function 100 has a 20 dB/decade roll off. Transfer function 100 has a closed-loop 3 dB bandwidth f$_{3dB}$ at the cross-over frequency.

Figure 4B:
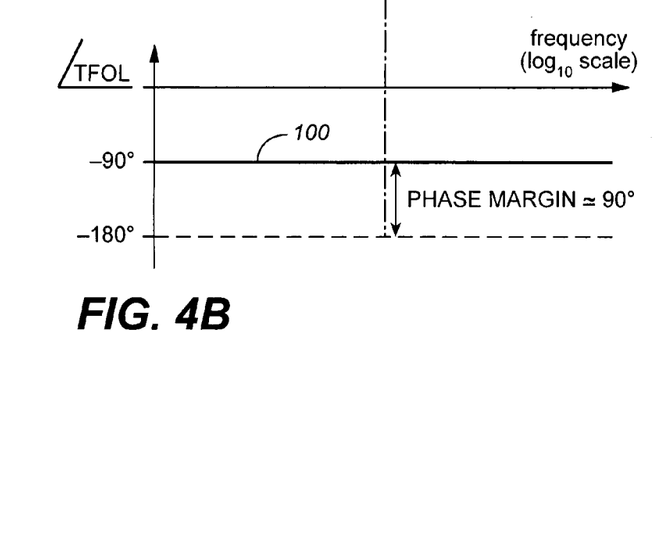

FIG. 4B is a graph illustrating the phase angle of the open loop phase transfer function (TFOL) 100 in degrees as a function of frequency (in the log base 10 scale) for the typical DLL. The transfer function has a phase margin of approximately 90 degrees, which is measured at the unity-gain cross-over frequency shown in FIG. 4A.

Figure 5A:
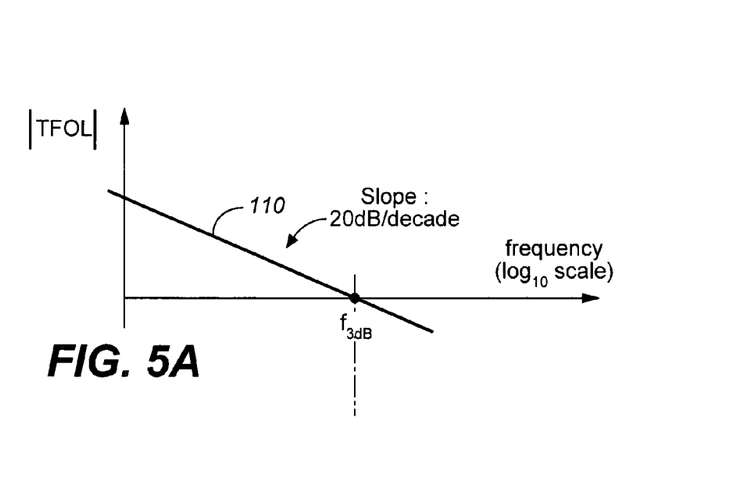
FIGS. 5A and 5B are graphs illustrating the magnitude and phase angle of the open loop phase transfer function of the DLL shown in FIG. 1, which has an auxiliary delay element in the loop, as a function of frequency.
Figure 5B:
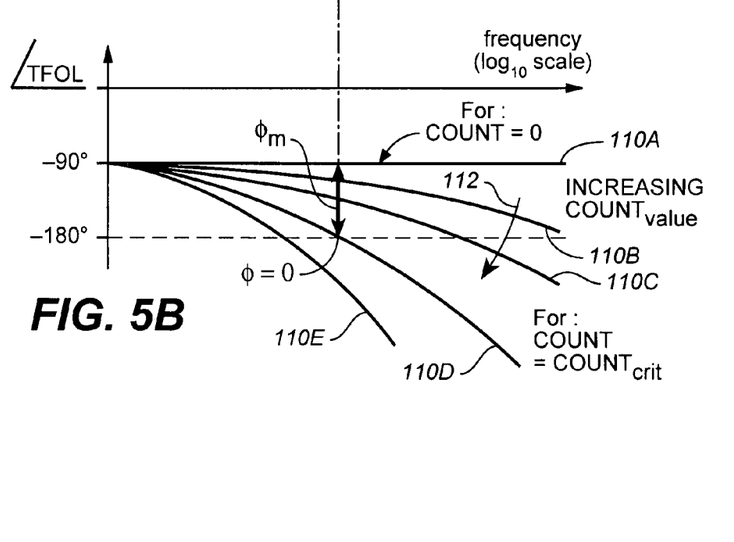

FIG. 5A is a graph illustrating the magnitude of the open loop phase transfer function (TFOL) in dB for DLL 10, which has an auxiliary delay line 48 in the loop. Transfer function 110 has a 20 dB/decade roll off and a closed-loop 3 dB bandwidth f$_{3dB}$. Transfer function 110 shown in FIG. 5A is identical to transfer function 100 shown in FIG. 4A.

FIG. 4B is a graph showing the phase angle of the open loop phase transfer function (TFOL) 100 in degrees for DLL 10 as a function of frequency (in the log base 10 scale). The normal transfer function 110A (shown in solid) of DLL 10 has a phase margin $\phi_m$. Dashed lines 110B–110E represent changes in the open loop phase transfer function along arrow 112 as the value of COUNT (and thus the delay through delay line 48) is progressively increased from zero. At 110D, the phase margin $\phi_m$ degrades to zero, which causes DLL 10 to become unstable. Thus, the increase in delay that is required to yield $\phi_m=0$ is related to the value of the original phase margin. When the added delay is increased to a value that equals the original loop phase margin, the DLL becomes unstable. The greater the original phase margin, the greater the delay that is necessary to cause the DLL to oscillate. Thus, by detecting the minimum value of excess delay that induces instability, the original phase margin of DLL 10 can be determined.

Based on a continuous-time model for DLL 10, the minimum theoretical value of additional delay (T$_{ADD}$) that will cause instability is given by:

$$T_{ADD}=1/(4*f_{3dB}) \qquad \text{EQ. 1}$$

where f$_{3dB}$ is the closed-loop 3 dB bandwidth that, in turn, is given by:

$$f_{3dB}=(K_{DL}*I_{CP}*F_{REF})/2*\pi*C) \qquad \text{EQ. 2}$$

where:
K$_{DL}$ is the value of the delay constant of the Main Voltage Controlled Delay Line in (V/s);
I$_{CP}$ is the value of the Charge Pump Current (A);
F$_{REF}$ is the value of the input clock frequency (Hz); and
C is the value of the Loop Capacitor (F).

For a specific DLL design, the additional delay that is added by the auxiliary delay line is selected accordingly to provide enough excess delay to cause instability. The particular delay increments provided by each delay cell can be selected to suit a particular application.

The continuous-time open-loop transfer function (TFOL(s)) for DLL 10 is given by:

$$TFOL(s)=(2*\pi*f_{3dB})/s \qquad \text{EQ. 3}$$

Therefore, DLL 10 is a Type I, first order control system. However, any type of DLL having any type or order can be used with the present invention.

Figure 6:
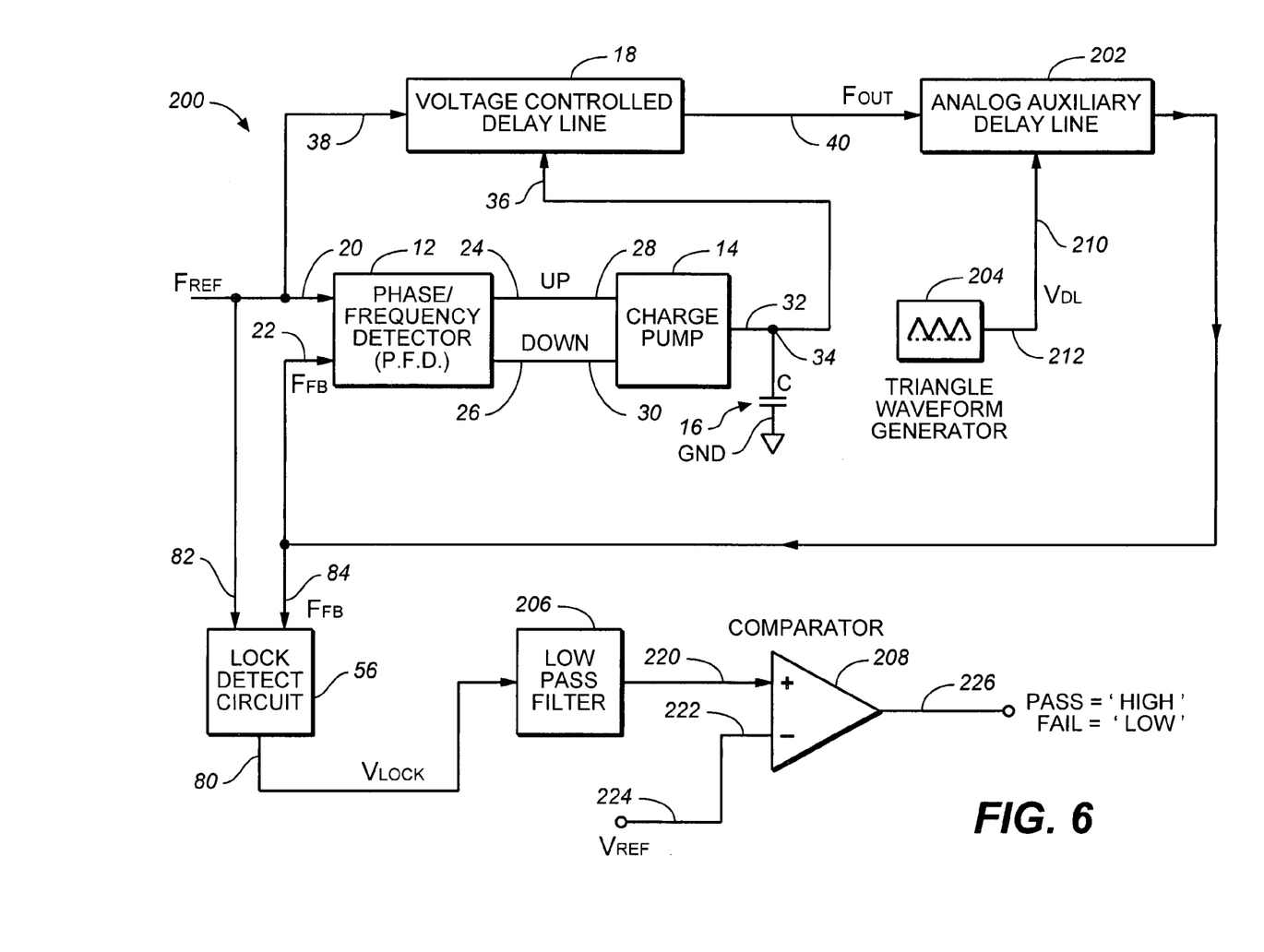
FIG. 6 is a diagram of a DLL having an analog auxiliary delay element according to an alternative embodiment of the present invention.

FIG. 6 is a diagram of a DLL 200 according to an alternative embodiment of the present invention. The same reference numerals are used in FIG. 6 as were used in FIG. 1 for the same or similar elements. Similar to the embodiment shown in FIG. 1, DLL 200 includes phase/frequency detector 12, charge pump 14, loop capacitor 16 and voltage-controlled delay line 18. However, an analog auxiliary delay line 202 instead of a digital delay line is coupled in the feedback path between DLL output 40 and feedback input 22 of phase/frequency detector 12.

DLL 200 further includes control voltage generator 204, lock detect circuit 56, low pass filter 206 and comparator 208. In one embodiment, analog delay line 202 is a voltage-controlled delay line having a control voltage input 210, which is coupled to output 212 of control voltage generator 204. Control voltage generator 204 generates a control voltage V$_{DL}$, which controls the delay through variable delay element 42. If n-channel current sources are used to supply current to the delay elements within delay line 202, for example, the larger the voltage V$_{DL}$, the smaller the delay through delay line 202. Likewise, the smaller the voltage V$_{DL}$, the larger the delay through delay line 202.

In a normal operating mode, control voltage generator 204 sets V$_{DL}$ such that the variable delay element 204 adds substantially no delay or minimal delay to DLL 200. In a test mode, a fixed frequency reference clock signal is applied to reference input $F_{REF}$, and control voltage generator 204 decreases $V_{DL}$ until DLL 200 becomes unstable. In one embodiment, control voltage $V_{DL}$ has a triangular waveform in the test mode, which repetitively decreases from an initial value to a voltage below a critical control voltage $V_{CRIT}$ and then increases back to the initial voltage. The period of the triangular waveform is at least 100 times the specified DLL lock time, for example. However, other periods can also be used.

At the critical control voltage $V_{CRIT}$, analog delay element 202 has a critical delay $T_{CRIT}$ that causes DLL 200 to drop out of phase lock. Other types of increasing, decreasing or repetitive waveforms can also be used. For example, control voltage generator 204 can be adapted to incrementally vary analog control voltage $V_{DL}$ over time during the test mode.

Lock detect circuit 56 operates in the same fashion as in FIG. 1 and sets $V_{LOCK}$ on lock output 80 high (or low) when DLL 200 is in phase lock and sets $V_{LOCK}$ low (or high) when DLL 200 is out of phase lock. $V_{LOCK}$ is coupled to the input of low-pass filter 206. The output of low-pass filer 206 is coupled to non-inverting input 220 of comparator 208. Inverting input 222 is coupled to reference voltage reference input 224. Reference voltage input 224 is tied to a reference voltage $V_{REF}$ that represents a filtered DC voltage that would be present at the output of low-pass filter 206 when DLL 200 has a desired phase margin.

During test mode operation, the duty cycle of $V_{LOCK}$ represents a measure of the DLL phase margin. The greater the duty cycle of $V_{LOCK}$, the greater the phase margin of DLL 200 since more delay can be added without dropping out of phase lock. If the digital voltage levels on $V_{LOCK}$ are well defined and if the cut-off frequency of low-pass filter 206 is low enough compared to the frequency of $V_{LOCK}$, subsequent low-pass filtering through low-pass filter 206 generates a DC level that is fed to non-inverting input 220 of comparator 208. A relatively high value of phase margin will result in a relatively high DC value at comparator input 220. A relatively low value of phase margin will result in a relatively low DC value at comparator input 220. Comparator output 226 gives a phase margin pass/fail indication depending on whether the filtered $V_{LOCK}$ signal has a DC value that is above or below the level of $V_{REF}$.

In another alternative embodiment (not shown), the phase measurement circuit simply measures the control voltage $V_{DL}$ at which DLL 200 becomes unstable and compares that voltage to a reference voltage that is indicative of a particular phase margin. Other measurement circuits can also be used.

Figure 7:
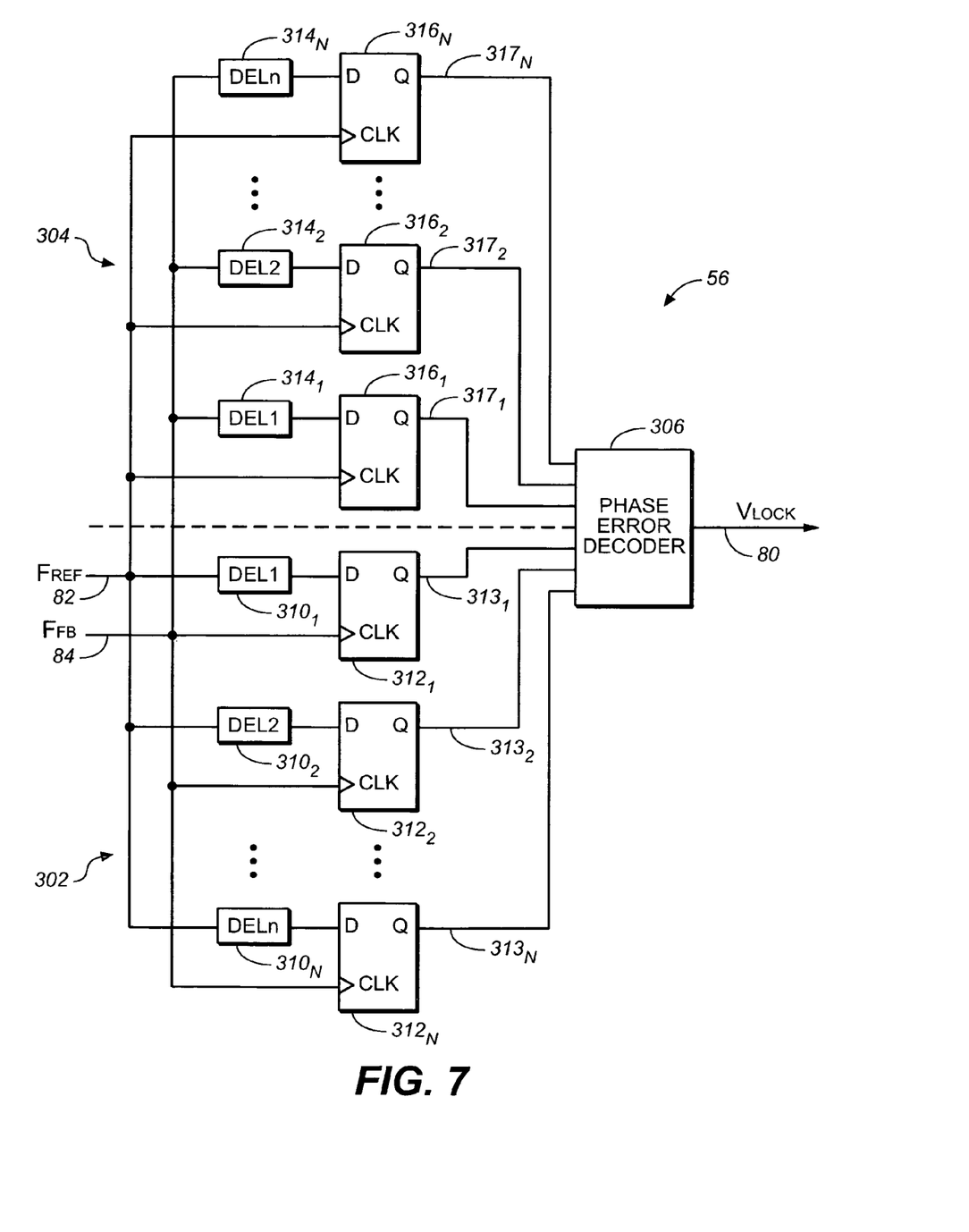
FIG. 7 is a block diagram illustrating a lock detect circuit used in the DLLs shown in FIGS. 1 and 6, according to one embodiment of the present invention.

FIG. 7 is a block diagram illustrating lock detect circuit 56 in greater detail according to one embodiment of the present invention. Lock detect circuit 56 includes clock inputs 82 and 84 ($F_{REF}$ and $F_{FB}$), phase lead detector 302, phase lag detector 304, phase error decoder 306 and lock output 80.

Phase lead detector 302 includes one or more phase lead delay elements $310_1$–$310_N$ (labeled DEL1–DELn) and one or more phase lead latches $312_1$–$312_N$, where N is a positive integer variable. Similarly, phase lag detector 304 includes one or more phase lag delay elements $314_1$–$314_N$ (labeled DEL1–DELn) and one or more phase lag latches $316_1$–$316_N$. In one embodiment, latches $312_1$–$312_N$ and $316_1$–$316_N$ each include a positive edge-trigged D-type flip-flop having a latch data input "D", a latch data output "Q" and a latch control or clock input "CLK". However, other types of positive or negative edge-triggered latches can also be used in alternative embodiments.

Referring to phase lead detector 302, the latch data inputs "D" of phase lead latches $312_1$–$312_N$ are coupled to clock input 82 ($F_{REF}$) through respective ones of the phase lead delay elements $310_1$–$310_N$. The latch control inputs "CLK" of phase lead latches $312_1$–$312_N$ are coupled to clock input 84 ($F_{FB}$). The latch data outputs "Q" of phase lead latches $312_1$–$312_N$ together form a multiple-bit phase lead error output $313_1$–$313_N$, which is coupled to phase error decoder 306.

Referring to phase lag detector 304, the latch data inputs "D" of phase lag latches $316_1$–$316_N$ are coupled to clock input 84 ($F_{FB}$) through respective ones of the phase lag delay elements $314_1$–$314_N$. The latch control inputs "CLK" of phase lag latches $316_1$–$316_N$ are coupled to clock input 82 ($F_{REF}$) The latch data outputs "Q" of phase lag latches $316_1$–$316_N$ together form a multiple-bit phase lag error output $317_1$–$317_N$, which is coupled to phase error decoder 306.

Phase lead delay elements $310_1$–$310_N$ represent the total delay from clock input 82 to the latch data output "Q" of the respective phase lead latches $312_1$–$312_N$, including any internal delay within that latch. The internal delay can include the set-up time of the latch data input "D" relative to the latch control input "CLK". Phase lead delay elements $310_1$–$310_N$ can also include additional external delay elements, such as an even number of series-connected inverters, coupled between the latch data input "D" and clock signal input CLK1. Similarly, each phase lag delay element $314_1$–$314_N$ represents the total delay from clock input 84 to the corresponding latch data output "Q" of phase lag latches $316_1$–$316_N$.

In order to provide a graduated measure of the phase error, each phase lead delay element $310_1$–$310_N$ has a different time delay than the other phase lead delay elements $310_1$–$310_N$, and each phase lag delay element $314_1$–$314_N$ has a different time delay than the other phase lag delay elements $314_1$–$314_N$. In one embodiment, phase lead delay element $310_1$ and phase lag delay element $314_1$ include only the internal delay of latches $312_1$ and $316_1$, and delay elements $310_2$–$310_N$ and $314_2$–$314_N$ have additional external delays. Multiple copies of the same base delay are used in delay elements $310_2$–$310_N$ and $314_2$–$314_N$ to provide progressively greater delays for phase lead latches $312_2$–$312_N$ and phase lag latches $316_2$–$316_N$, respectively.

During operation, if the rising edge of $F_{REF}$ leads the rising edge of $F_{FB}$ by at least the delay of phase lead delay element $310_1$, then phase lead latch $312_1$ stores a logic "1" on its "Q" output. If not phase lead latch $312_1$ stores a logic "0". If the rising edge of $F_{REF}$ leads the rising edge of $F_{FB}$ by at least the delay of phase lead delay element $310_2$, which is greater than the delay of phase lead delay element $310_1$, then phase lead latch $312_2$ stores a logic "1" on its "Q" output. This operation is repeated for each of the phase lead latches $312_1$–$312_N$. Thus, if $F_{REF}$ leads $F_{FB}$, then the logic pattern formed by phase lead error outputs $313_1$–$313_N$ represents the magnitude of the phase difference between $F_{REF}$ and $F_{FB}$ in terms of the delay of delay elements $310_1$–$310_N$. The granularity of the phase error measurement can be adjusted by adjusting the number of phase lead latches and the difference in delay between each of the phase lead delay elements.

Similarly, if clock signal input $F_{REF}$ lags clock signal input $F_{FB}$ by at least the delay of phase lag delay element $314_1$, then phase lag latch $316_1$ stores a logic "1" on its "Q" output. If not, phase lag latch $316_1$ stores a logic "0". This operation repeats for each of the phase lag latches $316_1$–$316_N$. Thus, if $F_{REF}$ lags $F_{FB}$, then the logic patterned formed by phase lag error outputs $317_1$–$317_N$ represents the magnitude of the phase difference between $F_{REF}$ and $F_{FB}$ in terms of the delay of delay elements $314_1$–$314_N$. In one embodiment, phase lag delay elements $314_1$–$314_N$ have the same delays as corresponding ones of phase lead delay elements $310_1$–$310_N$. The combined logic pattern formed by phase lead error outputs $313_1$–$313_N$ and phase lag error outputs $317_1$–$317_N$ therefore reflects a direction and magnitude of a phase difference between $F_{REF}$ and $F_{FB}$.

Phase error decoder 306 decodes the logic patterns formed by phase lead error outputs $313_1$–$313_N$ and phase lag error outputs $317_1$–$317_N$ to produce an estimate of the phase difference between $F_{REF}$ and $F_{FB}$. Phase error decoder 306 can include any suitable decoder circuit, such as combinational logic, a state machine or a microprocessor and can be implemented in hardware, software or a combination of both.

In one embodiment, lock detect output 80 is a single-bit status flag that is high if the phase error is below a predetermined threshold level and is low if the phase error is above the predetermined threshold level. This threshold level can be pre-set within phase error decoder 306, or can be selected through a threshold select input (not shown). In either case, phase error decoder 306 monitors a selected pair of latches $312_1$–$312_N$ and $316_1$–$316_N$ and activates lock output 80 as a status flag, if the either of the respective phase error outputs $313_1$–$313_N$ and $317_1$–$317_N$ is high. This indicates that the phase error exceeds the delay of the selected delay element. In an alternative embodiment, only one pair of latches 312 and 316 are used and the delay through these latches represents a minimum phase difference for phase lock.

In other alternative embodiments, lock output 80 can be a multiple-bit digital estimate value or an analog level, depending on the particular configuration adopted. In one embodiment, phase error decoder 306 decodes all of the phase error outputs $313_1$–$313_N$ and $317_1$–$317_N$ and, based on the logic patterns produced on these outputs, generates a phase error output signal representing the magnitude and direction of the phase error. Other types of lock detect circuits can also be used with the present invention.

Figure 8:
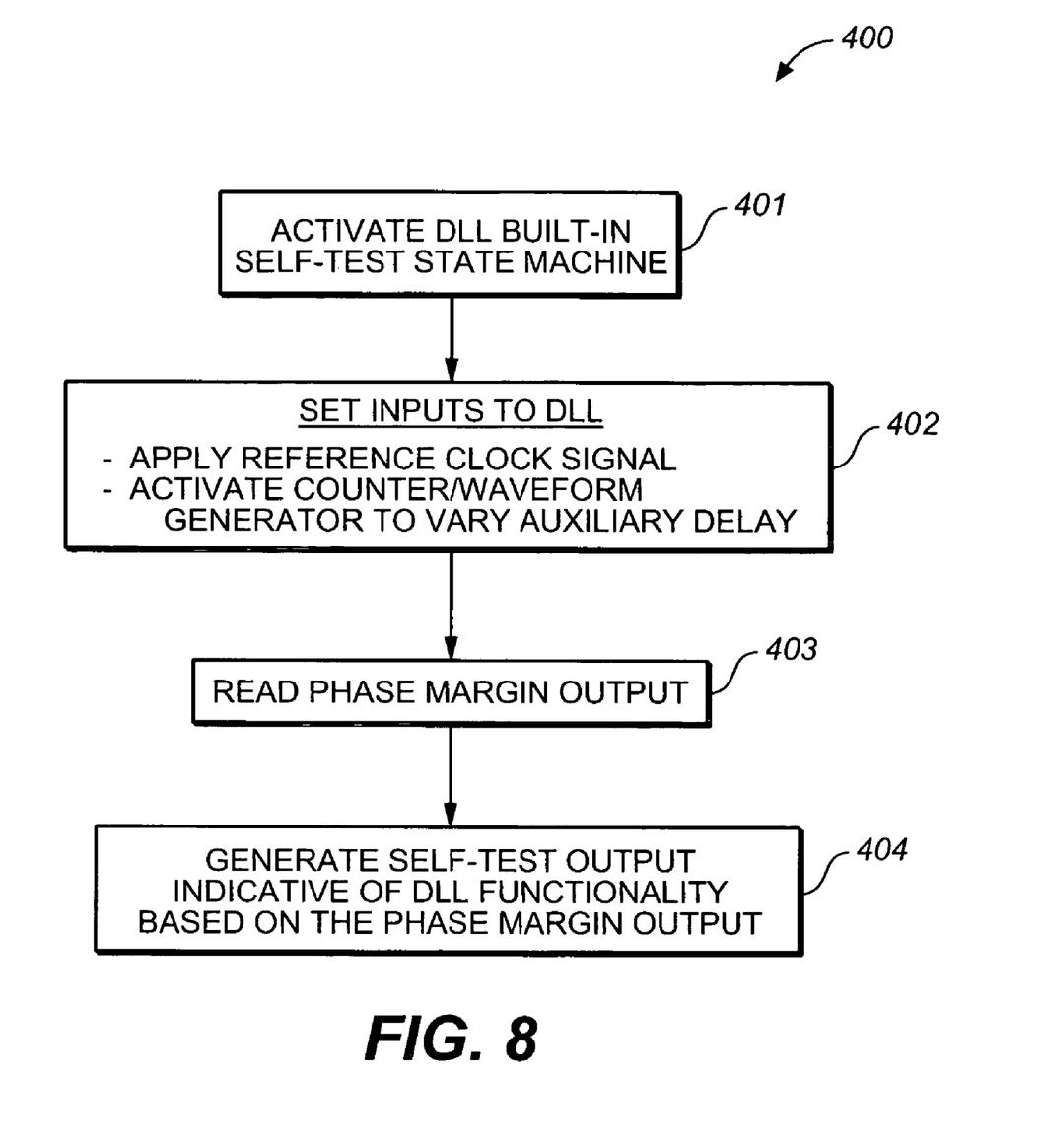
FIG. 8 is a flow chart illustrating a method of performing a built-in self-test of an embedded DLL according to one embodiment of the present invention.

FIG. 8 is a flow chart illustrating a method 400 of performing a built-in self-test of an embedded DLL, according to one embodiment of the present invention. Integrated circuits often include built-in self-test circuitry for performing self-tests of certain circuit elements or groups of elements embedded within the integrated circuit. These self tests can be performed after the integrated circuit is fabricated and/or periodically during operation to detect fabrication faults, operational failures, performance degradation and other functional problems. If a functional problem is detected, the self-test circuitry outputs a flag or other indication of the failure. Built-in self-test circuitry can be implemented in hardware, software or a combination of both hardware and software.

In one embodiment of the present invention, the phase margin measurement of performed by a built-in self-test circuit that is embedded within the integrated circuit on which the DLL is fabricated. The built-in self-test circuit is implemented as a state machine which, when activated, drives the DLL inputs, reads the resulting DLL outputs and generates a corresponding self-test output indicative of whether the DLL is functional. Referring to FIG. 8, the state machine is activated at step 401. At step 402, the state machine applies the reference clock signal to the DLL reference clock input and activates the auxiliary delay. In the embodiment shown in FIG. 1, the state machine activates up/down counter 52 to begin varying the auxiliary delay. In the embodiment shown in FIG. 6, the state machine activates triangular waveform generator 204.

After a certain period of time, the state machine reads the phase margin output from the DLL, such as the latched count value in FIG. 1 or the comparator output shown in FIG. 6, at step 403. Based on the phase margin output read at step 403, the state machine generates a self-test output at step 404. This self-test output can be used as an indicator of DLL functionality. Thus, the DLL of the present invention allows the DLL to be tested periodically for proper phase margin as part of the integrated circuit's routine self-test function.

Although the present invention has been described with reference to preferred embodiments, workers skilled in the art will recognize that changes may be made in form and detail without departing from the spirit and scope of the invention. For example, the present invention can be implemented on integrated circuits having various technologies, such as MOS technology. Also, the particular DLL described herein is provided as an example only. Various other types of DLL circuits can also be used. The functions of the phase margin measurement circuit can be performed in the analog domain or the digital domain or a combination of both. Digital elements can be implemented in hardware or software and can include combinational logic, state machines, a microprocessor or a programmed computer, for example. Any type of variable delay can be added in the feedback loop in any manner for testing the phase margin of the DLL. The term "coupled" used in the specification and the claims can include various types of connections or couplings and can include a direct connection or a connection through one or more intermediate components.

What is claimed is:

1. A method of measuring phase margin of a delay-locked loop (DLL) having a reference input, the method comprising:
   (a) applying a reference clock to the reference input;
   (b) providing an auxiliary variable delay within the DLL;
   (c) varying the auxiliary variable delay until the DLL becomes unstable; and
   (d) generating a phase margin output related to the phase margin as a function of a value of the auxiliary variable delay at which the DLL becomes unstable.

2. The method of claim 1 wherein:
   step (b) comprises providing an auxiliary delay line within a delay loop in the DLL, wherein the auxiliary delay line comprises a delay input, a delay output and a plurality of delay cells which are coupled together in series with the delay input; and
   step (c) comprises multiplexing outputs of respective ones of the delay cells to the delay output.

3. The method of claim 2 wherein step (c) further comprises:
   (c) (1) providing a counter having a count output;
   (c) (2) multiplexing the outputs of respective ones of the delay cells to the delay output based on the count output; and
   (c) (3) repetitively incrementing and decrementing the count output.

4. The method of claim 3 wherein step (d) comprises:
   (d) (1) generating a phase margin output related to the phase margin as a function of the count output at which the DLL switches between a phase-locked state and a phase-unlocked state.

5. The method of claim 4 wherein step (d) further comprises:
   (d) (2) generating a lock detect signal having a first logic state when the DLL is in the phase-locked state and a second, different logic state when DLL is in the phase-unlocked state; and
   (d) (3) latching the count output when the lock detect signal switches between the first and second logic states.

6. The method of claim 1 wherein:
   step (b) comprises providing an analog voltage-controlled delay element within the DLL, which has a control voltage input; and
   step (c) comprises applying a control voltage to the control voltage input and varying the control voltage.

7. The method of claim 6 wherein varying the control voltage comprises varying the control voltage such that the control voltage forms a triangular waveform over time.

8. The method of claim 7 wherein the generating step (d) comprises:
   (d) (1) generating a lock detect signal having a first logic state when the DLL is in a phase-locked state and a second, different logic state when DLL is in a phase-unlocked state; and
   (d) (2) generating the phase margin output as a function of a duty cycle of the lock detect signal as the control voltage is varied over time.

9. The method of claim 8 wherein step (d)(2) comprises:
   (d) (2) (i) low-pass filtering the lock detect signal to produce a filtered lock detect signal having a DC voltage;
   (d) (2) (ii) comparing the DC voltage with a reference voltage level to produce a comparison output; and
   (d) (2) (iii) generating the phase margin output as a function of the comparison output.

10. The method of claim 1 wherein the DLL is embedded within an integrated circuit and wherein the method further comprises:
   (e) activating a built-in self-test state machine which is embedded within the integrated circuit and adapted to perform step (c); and
   (f) reading the phase margin output with the built-in self-test state machine and generating a self-test output from the state machine that represents functionality of the DLL based on the phase margin output.

11. A delay-locked loop (DLL) comprising:
   a reference input;
   a feedback input;
   a DLL output which is coupled to the feedback input;
   a phase detector coupled to the reference input and the feedback input and having a phase control output;
   a charge pump coupled to the phase control output;
   a loop filter coupled to an output of the charge pump;
   a main variable delay element coupled between the reference input and the DLL output and having a first control input coupled to the loop filter;
   an auxiliary variable delay element coupled in series with the main variable delay element, between the reference input and the feedback input, and having a second control input and an auxiliary delay that is variable to a critical delay at which the DLL becomes unstable; and
   a phase margin measurement circuit which generates a phase margin output based on the critical delay at which the DLL becomes unstable.

12. The DLL of claim 11 wherein the auxiliary variable delay element comprises:
   an auxiliary delay input;
   an auxiliary delay output;
   a plurality of delay cells coupled together in series with the auxiliary delay input; and
   a multiplexer comprising a plurality of multiplexer data inputs coupled to respective outputs of the plurality of delay cells, a multiplexer data output coupled to the auxiliary delay output and a select control input.

13. The DLL of claim 12 wherein the phase margin measurement circuit comprises:
   a counter having a count output coupled to the select control input; and
   an output latch having a latch input coupled to the count output, a latch output, and a latch control input.

14. The DLL of claim 13 wherein the phase margin measurement circuit further comprises:
   a lock detect circuit having clock inputs, which are coupled to respective ones of the reference input and the feedback input, and a lock output coupled to the latch control input, wherein the lock output has a first logic state when the DLL is in a phase-locked state and a second, different logic state when DLL is in a phase-unlocked state.

15. The DLL of claim 11 wherein the auxiliary variable delay element comprises:
   an analog voltage-controlled delay element having a control voltage input; and
   a control voltage generator having a control voltage output coupled to the control voltage input.

16. The DLL of claim 15 wherein the control voltage generator generates a control voltage on the control voltage output that has a triangular waveform over time.

17. The DLL of claim 16 wherein the phase margin measurement circuit comprises comprises:
   a lock detect circuit having clock inputs which are coupled to respective ones of the reference input and the feedback input and a lock output which has a first logic state when the DLL is in a phase-locked state and a second, different logic state when DLL is in a phase-unlocked state;
   a low-pass filter having a filter input coupled to the lock output and having a filter output; and
   a comparator having a first comparator input coupled to the filter output, a second comparator input coupled to the a reference voltage and a comparator output, which is indicative of the phase margin.

18. A delay-locked loop (DLL) comprising:
   a reference input for receiving a reference signal;
   a feedback input for receiving a feedback signal;
   a DLL output coupled to the feedback input;
   first variable delay means coupled between the reference input and the DLL output for providing a first variable delay;
   phase control means for detecting a phase difference between the reference signal and the feedback signal and for varying the first variable delay as a function of the phase difference; and
   phase margin measurement means for adding further delay in series with the first variable delay means, between the reference input and the feedback input, and for generating a phase margin output as a function of an amount of the further delay that is required for the DLL to become unstable.

* * * * *